United States Patent [19]

Harada

[11] Patent Number: 5,559,435

[45] Date of Patent: Sep. 24, 1996

[54] INCLINED MAGNETIC FIELD GENERATOR

[75] Inventor: Akihiro Harada, Hyogo-ken, Japan

[73] Assignee: Mitsubishi Denki Kabushiki Kaisha, Tokyo, Japan

[21] Appl. No.: 490,860

[22] Filed: Jun. 15, 1995

[30] Foreign Application Priority Data

Jul. 1, 1994 [JP] Japan .................................. 6-151091

[51] Int. Cl.⁶ ........................................................ G01V 3/00
[52] U.S. Cl. ........................ 324/318; 324/307; 128/653.2
[58] Field of Search ....................................... 324/300, 307, 324/309, 311, 312, 313, 314, 318, 322; 335/299; 128/653.2, 653.3

[56] References Cited

U.S. PATENT DOCUMENTS 4,737,715  4/1988  Ikeda et al. .............................. 324/318
5,293,519  3/1994  Yoshino et al. .......................... 324/322

FOREIGN PATENT DOCUMENTS 170611    10/1987  Japan .
3-173530  7/1991   Japan .
5-76507   3/1993   Japan .

*Primary Examiner*—Michael Tokar
*Attorney, Agent, or Firm*—Sughrue, Mion, Zinn, Macpeak & Seas

[57] ABSTRACT

To reduce the cutting length of a conductor from which coils are formed, and further to reduce vibration and noise generated by main coils and shielding coils, the ends of adjacent portions of the conductor are cut simultaneously by setting the interval between them at a fixed cutting width. Spacers 30 are fixed between coils 28 and main shielding coils 29 by an adhesive, and electromagnetic mechanical forces opposite in direction and generated by the coils 28 and 29 offset each other, thus reducing vibration and noise.

8 Claims, 5 Drawing Sheets

5,559,435

INCLINED MAGNETIC FIELD GENERATOR

BACKGROUND OF THE INVENTION

1. [Field of the Invention]

This invention relates to an inclined magnetic field generator for use in a magnetic resonance diagnostic apparatus for medical use.

2. [Description of the Prior Art]

FIG. 5 is a structural diagram showing conceptually the entire configuration of a magnetic resonance diagnostic apparatus disclosed in Japanese Patent Publication No. 3173530, for example.

In FIG. 5, reference numeral 1 represents a magnet for generating a magnetostatic field in an inner space 2. Numeral 3 represents a subject who is accommodated in the magnetostatic field while lying on the bed 4, for example. Numeral 5 represents an irradiation coil disposed around the subject 3. Numeral 6 denotes an inclined magnetic field generator to which a drive current for excitation is supplied from an inclined magnetic field power source 7 and which is provided around the outside of the irradiation coil 5 to generate inclined magnetic fields in X, Y and Z axes which cross one another at a right angle. Numeral 8 represents a receiving Coil arranged near the head of the subject 3. Numeral 9 represents a transmitter connected to the irradiation coil 5, for supplying a high frequency signal for generating a high-frequency magnetic field so as to obtain a magnetic resonance signal.

Due to a function of a magnetostatic field, inclined magnetic field and high-frequency magnetic field, a magnetic resonance signal is generated from the subject 3. This magnetic resonance signal is detected by the receiving coil 8, and the signal received by a receiver 10 is processed by a data processor 11 to reproduce an image. As a result, the obtained data is displayed on a CRT display 12 as an image to be inspected.

Numeral 13 represents a controller for supplying a control signal to the inclined magnetic field power source 7, transmitter 9 and receiver 10 to control their operation contents and timings.

FIG. 6 is a front view of the main coils and shielding coils of an inclined magnetic field generator. FIG. 7 is a side view of FIG. 6.

In FIG. 6 and FIG. 7, a total of four coils 15 for the X axis, that is, two pairs of opposing coils 15 are disposed over a cylindrical bobbin 14, and a total of four coils 16 for the Y axis, that is, two pairs of opposing coils 16 are also disposed over the cylindrical bobbin 14. The coils 15 and 16 are all shaped like a saddle. Further, two coils 17 for the Z axis, not in a pair, are wound around the bobbin 14.

In FIG. 7, arrows provided in each of the coils 15, 16 and 17 indicate the directions of currents at an arbitrary moment which are concurrent with one another.

FIG. 8 is a development of conventional coils for the X and Y axes formed like a saddle by winding a conductor spirally and developed on a plane.

In FIG. 8, numeral 18 represents a spiral coil which is arranged to have a fixed width of a conductor 18a with the width of a groove 19 in the conductor 18a changing depending on the shape of the coil.

The coil 18 is formed by cutting and removing in a longitudinal direction both sides of the conductor 18a from a plate-form conductive member by water jet cutting or other technique.

FIG. 9 is a diagram showing the state of the coil when it is cut on a line IX—IX. In FIG. 9, numerals 20 and 21 represent cut grooves produced by water jet cutting, and 22 a waste material cut away for forming the groove 19 in the conductor 18a.

FIG. 10 is a structural diagram showing a combination of main coils and shielding coils for shielding magnetic field leakage to the outside. FIG. 11 is a sectional view of FIG. 10 cut on a line XI—XI.

In FIG. 10 and FIG. 11, numeral 23 represents main coils wound around the bobbin 14 over which the coils 15, 16 and 17 are disposed as shown in FIG. 7. Numeral 24 represents shielding coils for shielding magnetic field leakage from the main coils 23 to the outside, which consist of a coil 24a for the X axis, a coil 24b for the Y axis and a coil 24c for the Z axis, all wound around a bobbin 25 which is provided around the main coils 23 with a predetermined space therebetween. Numeral 26 represents a fixing tool or spacer provided between the bobbins 14 and 25, for fixing the relative positions of the coils 23 and 24 electrically and mechanically.

In the above configuration, the main coils 23 for generating a main inclined magnetic field are installed at a predetermined position of the bobbin 14, and are fixed to withstand electromagnetic mechanical forces which work at the time of operation in directions indicated by arrows 27.

Like the main coils 23, the shielding coils 24 are installed at a predetermined position of the bobbin 25, and are fixed to withstand electromagnetic mechanical forces which work at the time of operation in directions indicated by the arrows 27. The electromagnetic mechanical forces applied to the main coils 23 and the shielding coils 24 are opposite to each other in direction, but the same in phase, and are supported or borne by the bobbins 14 and 25, respectively. The coils 23 and 24 are fixed at predetermined relative positions by the fixing tool 26 to generate an inclined magnetic field.

Since the inclined magnetic field generator of the prior art is constructed as described above, both sides of the conductor must be cut along the entire length thereof. Therefore, the prior art has the problem of requiring a long time for cutting, due to a long length needed to be cut. In addition, it has another problem that a large amount of waste material is produced because a groove needs to be formed in the conductor.

Further, it involves the problem that the bobbin must be built rigid enough to prevent vibration and noise because it receives the electromagnetic mechanical force of the shielding coils.

Moreover, it involves another problem of insufficient cooling effect as the shielding coils are cooled through the bobbin when air is passed between the main coils and the shielding coils for forced cooling.

SUMMARY OF THE INVENTION

This invention has been made to overcome the above-described problems. Therefore, the invention relates to an inclined magnetic field generator wherein the conductor is formed into a shape that allows a reduction in cutting length.

This invention also relates to an inclined magnetic field generator wherein the shielding coils are fixed to the main coils by the spacers arranged in a radial manner so that these coils are brought in direct contact with cooling air.

According to one feature of the invention, in an inclined magnetic field generator wherein coils for the X and Y axes which are formed like a saddle by winding a conductor spirally are placed over a bobbin and main coils are composed of a coil for the Z axis wound around the bobbin and the coils for the X and Y axes, the interval between adjacent portions of the conductor from which the coils for the X and Y axes are formed is set substantially at a fixed cutting width for the conductor to be cut by a cutting means.

According to another feature of the invention, in an inclined magnetic field generator wherein coils for the X and Y axes which are formed like a saddle by winding a conductor spirally are placed over a bobbin, main coils are composed of a coil for the Z axis wound around the bobbin and the coils for the X and Y axes, and shielding coils for shielding magnetic flux leakage from the main coils are arranged opposed to the main coils with a predetermined space therebetween, the interval between adjacent portions of the conductor from which the coils for the X and Y axes are formed is set substantially at a fixed cutting width for the conductor to be cut by a cutting means.

According to a further feature of the invention, in the inclined magnetic field generator set forth above, spacers are arranged in a radial manner between the main coils and the shielding coils at predetermined intervals and fixed to the coils.

The spacers may also be arranged along the axial direction of the bobbin for the main coils and shielding coils so that a ventilation passage for cooling the coils is formed by the coils and the spacers in the axial direction of the bobbin.

Since the interval between adjacent portions of the conductor is set substantially at a fixed cutting width for the conductor to be cut by a cutting means, the groove between adjacent portions of the conductor can be cut by moving the nozzle just once when a water jet cutting machine is used as a cutting means, and the cutting width of the water jet nozzle of the machine is set at this interval. In addition, generation of waste materials can be reduced.

Since spacers are arranged in a radial manner between the main coils and the shielding coils at predetermined intervals and fixed to the coils, electromagnetic forces working in opposite directions offset each other, thus reducing vibration and noise.

According to the invention claimed in claim 4, since spacers are arranged along the axial direction of the bobbin for the main coils and shielding coils so that a ventilation passage for cooling the coils is formed by the coils and the spacers in the axial direction of the bobbin, these coils are brought in direct contact with cooling air, thus enhancing cooling performance.

The above and other objects, features and advantages of the invention will become more apparent from the following description when taken in conjunction with the accompanying drawings.

DESCRIPTION OF THE PREFERRED EMBODIMENT

Embodiment 1

Figure 1:
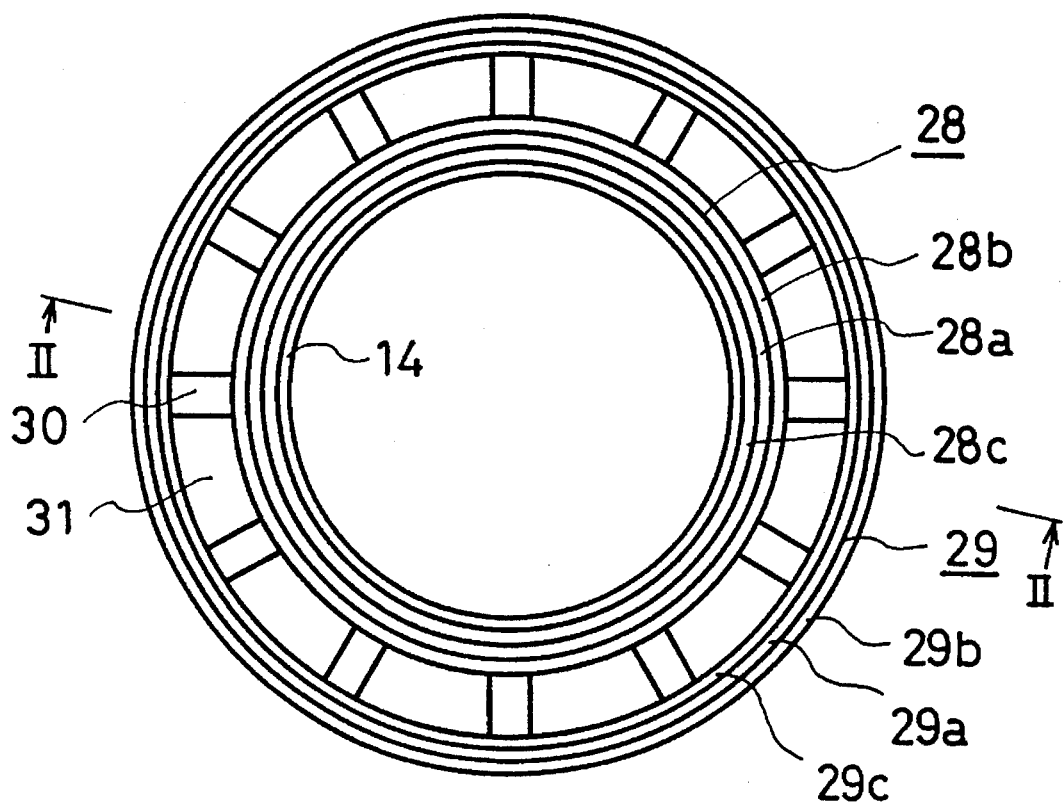
FIG. 1 is a front view of Embodiment 1 of the invention.
Figure 2:
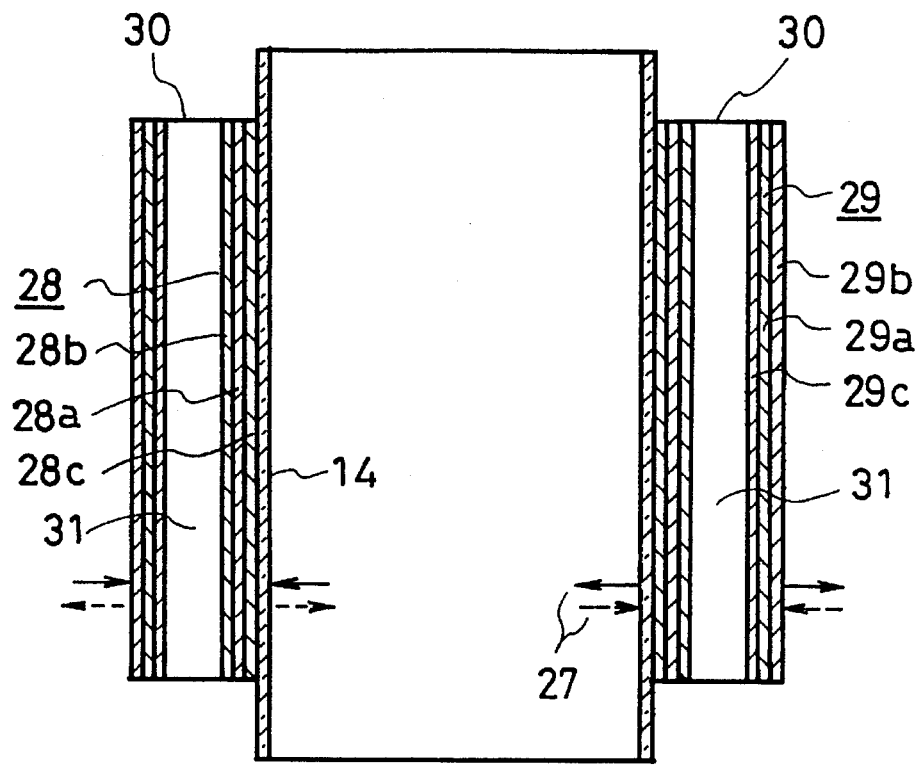
FIG. 2 is a sectional view cut on a line II—II of FIG. 1.
Figure 3:
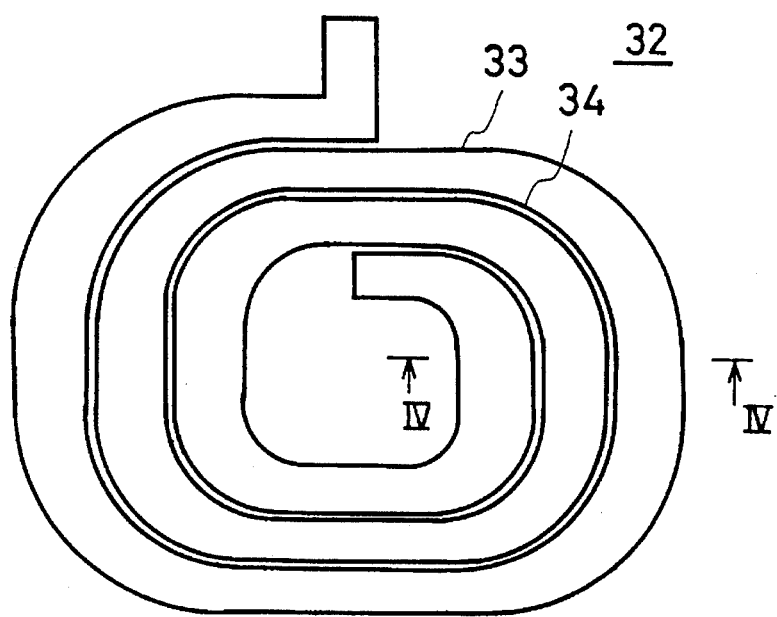
FIG. 3 is a development of coils for the X and Y axes of FIG. 1 developed on a plane.

FIG. 1 is a front view of the configuration of Embodiment 1 of the invention. FIG. 2 is a sectional view cut on a line II—II of FIG. 1. FIG. 3 is a development of spiral coils for the X and Y axes.

In FIG. 1 and FIG. 2, the bobbin 14 is the same as that of the prior art. Numeral 28 represents main coils wound around the bobbin 14 and composed of a coil 28a for the X axis, a coil 28b for the Y axis shown in FIG. 3 and a coil 28c for the Z axis which is the same as that of the prior art. Numeral 29 represents shielding coils for shielding magnetic field leakage from the main coils 28, which are wound around the main coils 28 with a predetermined space therebetween and composed of a coil 29a for the X axis, a coil 29b for the Y axis and 29c for the Z axis like the main coils 28.

Numeral 30 denotes spacers arranged in a radial manner between the main coils 28 and the shielding coils 29 at predetermined intervals and fixed to the coils 28 and 29. The spacers 30 are provided along the radial direction of the bobbin 14 and form a ventilation passage 31 together with the coils 28 and 29 in the axial direction of the bobbin 14.

Figure 4:
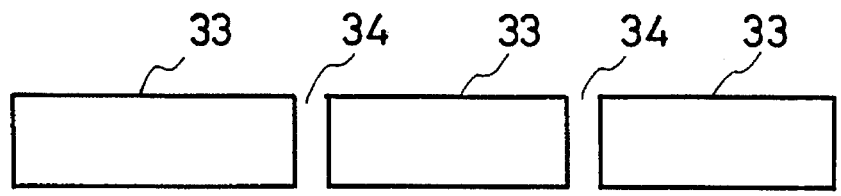
FIG. 4 is a diagram showing a section cut on a line IVIV of the conductor when it is cut.
Figure 5:
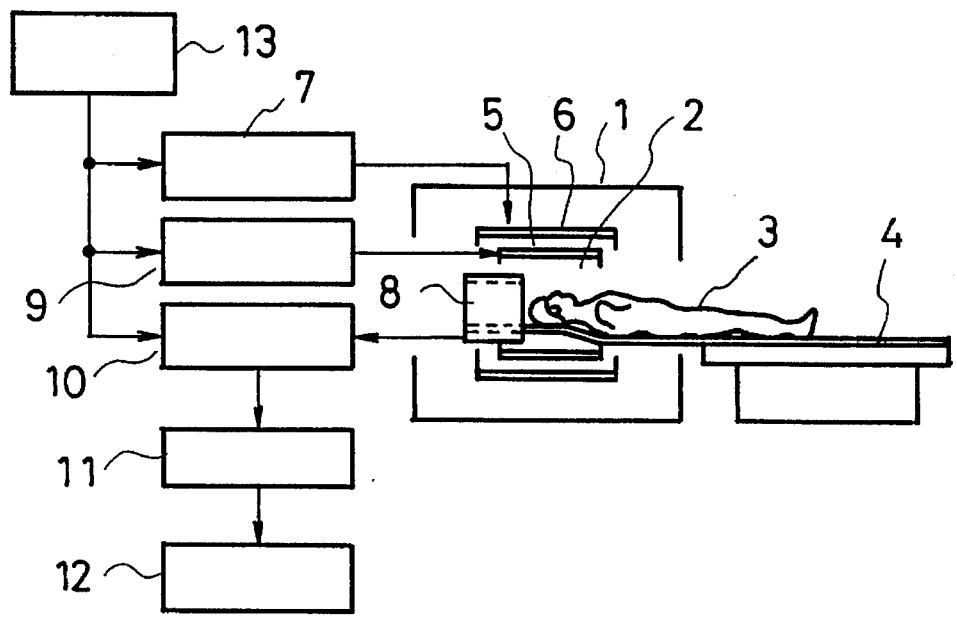
FIG. 5 is a structural diagram showing conceptually the entire configuration of a magnetic resonance diagnostic apparatus.
Figure 6:
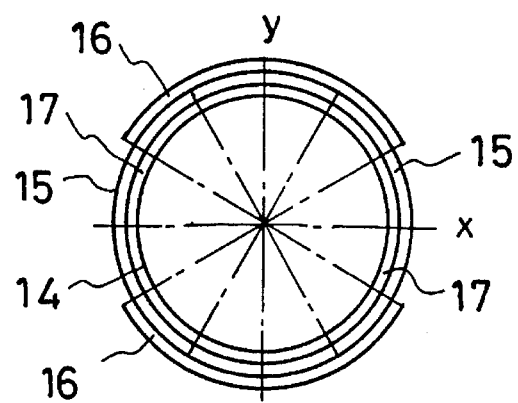
FIG. 6 is a front view of the main coils and shielding coils of the prior art inclined magnetic field generator.
Figure 7:
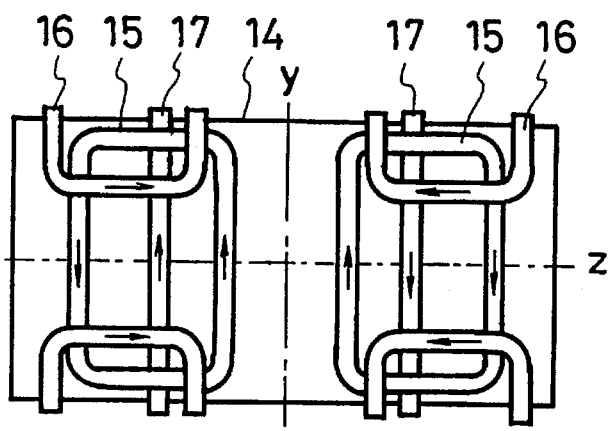
FIG. 7 is a side view of FIG. 6.
Figure 8:
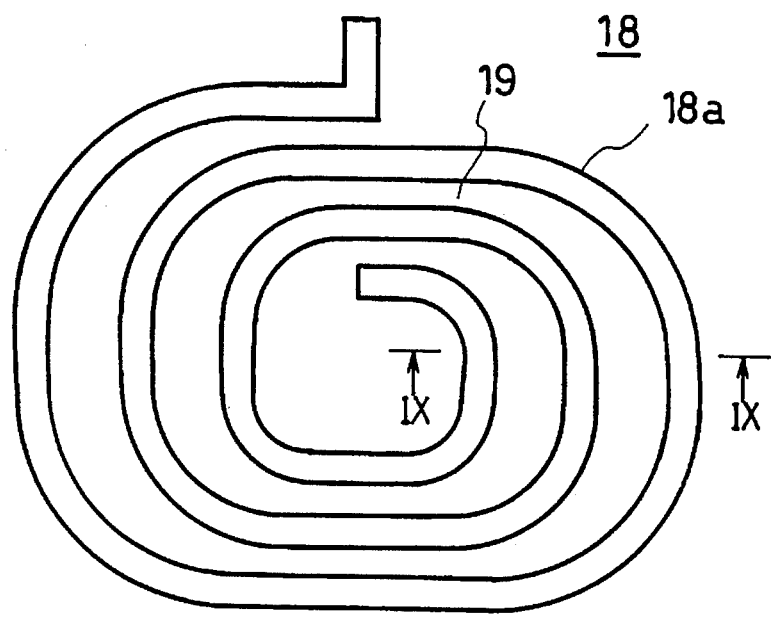
FIG. 8 is a development of coils for the X and Y axes of the prior art developed on a plane.
Figure 9:
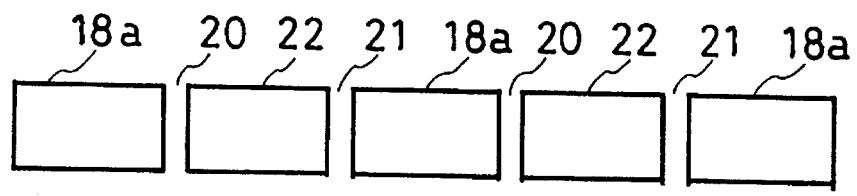
FIG. 9 is a diagram showing a section cut on a line IXIX of the conductor of FIG. 8 when it is cut.
Figure 10:
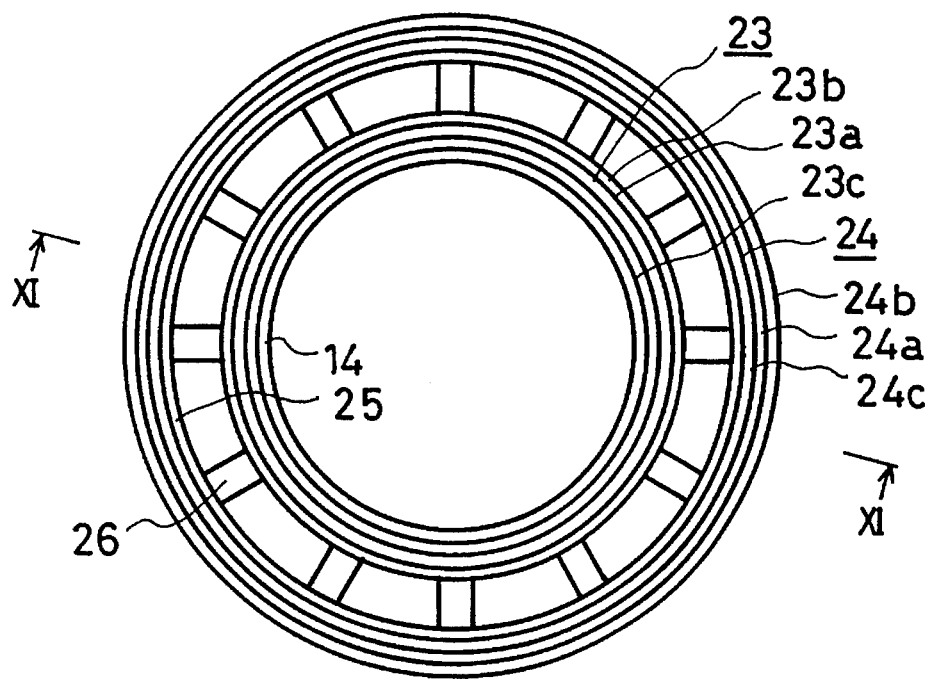
FIG. 10 is a structural diagram showing the combination of the main coils and the shielding coils of the prior art.
Figure 11:
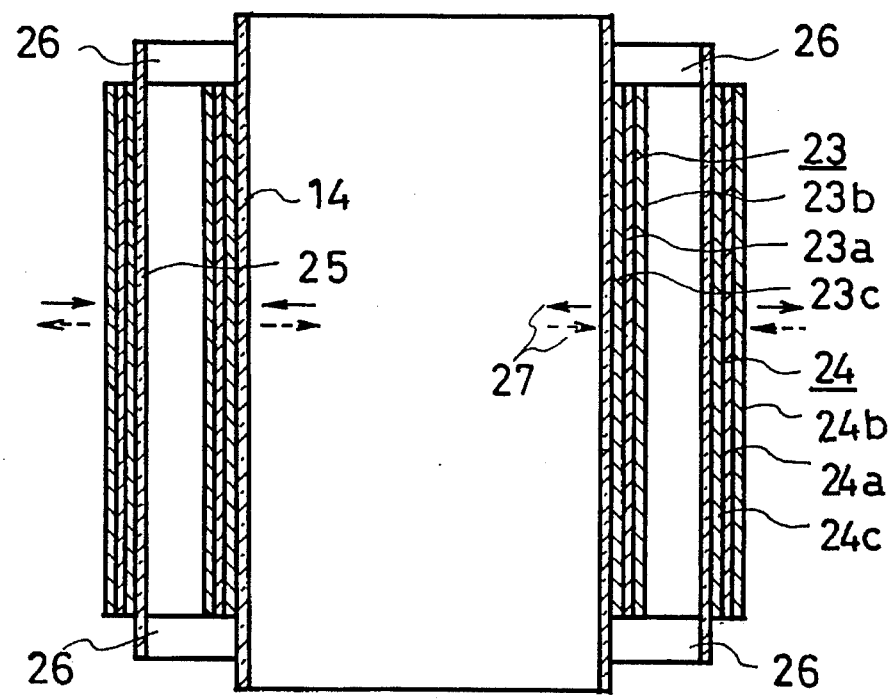
FIG. 11 is a sectional view cut on a line XI—XI of FIG. 10.

In FIG. 3, numeral 32 represents coils for the X and Y axes developed on a plane, which are formed like a saddle symmetrically about the center line in the vertical direction of the figure, that is, the axial direction of the bobbin 14. The width of the groove 34 formed in the conductor of the coil 32 is determined by the cutting width of the water jet nozzle of a water jet cutting machine, for example, as a cutting means, and is substantially the same long the entire length of the conductor as shown in FIG. 4. Therefore, as ends of adjacent portions of the conductor 33 are cut simultaneously, the cutting length is substantially the same as the total length of the conductor 3, thereby producing substantially no waste material.

Since the width of the groove 34 is narrowed to increase the width of the conductor 33, when a current density is fixed, the thickness of the conductor 33 can be reduced, thus facilitating the cutting operation.

As shown in FIG. 1 and FIG. 2, since the spacers 30 are arranged in a radial manner between the main coils 28 and the shielding coils 29 at predetermined intervals, and the spacers 30 are fixed to the coils 28 and 29 by an adhesive or other medium, electromagnetic forces indicated by arrows 27 which are opposite in direction and generated by the coils 28 and 29 offset each other, thus reducing vibration and noise.

The ventilation passage 31 for cooling the coils 28 and 29 is formed by the spacers 30 and the coils 28 and 29 so that the coils 28 and 29 are brought in direct contact with cooling air, thus enhancing cooling effect.

In the above-described embodiment, the coil 28c for the Z axis, coil 28a for the x axis and coil 28b for the Y axis of the main coils are wound around the bobbin 14 in the order named. However, it is also possible for the coil 28a for the X axis, coil 28b for the Y axis and coil 28c for the Z axis to be wound around the bobbin 14 in this order. The order of winding the coils 28a, 28b and 28c for each axis may be suitably determined.

Embodiment 2

In Embodiment 1, the inclined magnetic field generator which comprises the main coils 28 and the shielding coils 29 has been explained, but the inclined magnetic field generator may comprise only the main coils 28.

What is claimed is:

1. A magnetic field generator for generating a magnetic field in a magnetic resonance diagnostic apparatus in which a coil for an X axis field and a coil for a Y axis field are individually defined by a spiral conductor strip placed over a bobbin to thereby attain a saddle shade following a contour of said bobbin, and a coil for a Z axis field wound around said bobbin, wherein said coils for the X and Y axes are formed by spirally cutting a flat plate of conducting material wherein a width of the cut is set at a fixed cutting width through an entire length of the spiral conductor strip obtained from said flat plate.

2. A magnetic field generator for generating a magnetic field in a magnetic resonance diagnostic apparatus in which:

a coil for an X axis field and a coil for a Y axis field are individually defined by a spiral conductor strip placed over a bobbin to thereby attain a saddle shape following a contour of said bobbin;

a coil for a Z axis field wound around said bobbin and said coils for the X and Y axes; and shielding coils for shielding magnetic flux leakage from said main coils are arranged opposed to said coils for the Z axis field with a predetermined gap therebetween;

wherein said coils for the X and Y axes are formed by spirally cutting a flat plate of conducting material wherein a width of the cut is set at a fixed cutting width through an entire length of the spiral conductor strip obtained from said flat plate.

3. The magnetic field generator according to claim 2, wherein spacers are disposed between said coils for each axis field and said shielding coils.

4. The magnetic field generator according to claim 3, wherein said spacers are disposed along the axial direction of said bobbin to form a ventilation passage for cooling said coils in the axial direction of said bobbin.

5. The magnetic field generator according to claims 1 or 2, wherein said flat plate is cut by a water jet cutting machine.

6. The magnetic field generator according to claim 2, wherein said shielding coils are composed of shielding coils for the X, Y and Z axes corresponding to said coils for the X, Y and Z axes.

7. The magnetic field generator according to claims 1 or 2, wherein said spiral conductor strip constituting said coils for X and Y axes for generating a magnetic field is formed such that its width is large and a groove between adjacent portions of said conductor is narrow.

8. The magnetic field generator according to claims 3 or 4, wherein said spacers are fixed to both of said coils and said shielding coils by an adhesive.

\* \* \* \* \*